United States Patent
Chen et al.

(10) Patent No.: US 9,741,429 B1
(45) Date of Patent: Aug. 22, 2017

(54) MEMORY WITH WRITE ASSIST CIRCUIT (71) Applicant: Taiwan Semiconductor Manufacturing Co., Ltd., Hsinchu (TW)

(72) Inventors: Yen-Huei Chen, Hsinchu (TW); Hidehiro Fujiwara, Hsinchu (TW); Hung-Jen Liao, Hsinchu (TW); Jonathan Tsung-Yung Chang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/099,706

(22) Filed: Apr. 15, 2016

(51) Int. Cl.
*G11C 11/00* (2006.01)
*G11C 11/419* (2006.01)

(52) U.S. Cl.
CPC .................... *G11C 11/419* (2013.01)

(58) Field of Classification Search
CPC .................................................. G11C 11/419
USPC ........................................................ 365/154
See application file for complete search history.

(56) References Cited

U.S. PATENT DOCUMENTS

| | | | |
|---|---|---|---|
| 8,605,523 B2 | 12/2013 | Tao et al. | |
| 8,630,132 B2 | 1/2014 | Cheng et al. | |
| 8,760,948 B2 | 6/2014 | Tao et al. | |
| 8,908,421 B2 | 12/2014 | Liaw | |
| 8,929,160 B2 | 1/2015 | Katoch et al. | |
| 8,964,492 B2 | 2/2015 | Hsu et al. | |
| 8,982,643 B2 | 3/2015 | Lum | |
| 9,117,510 B2 | 8/2015 | Yang et al. | |
| 9,208,858 B1 | 12/2015 | Lin et al. | |
| 9,218,872 B1 | 12/2015 | Liaw | |
| 2007/0081379 A1* | 4/2007 | Clinton | G11C 11/419 365/149 |
| 2010/0329044 A1* | 12/2010 | Yeung | G11C 11/412 365/189.16 |
| 2011/0273952 A1* | 11/2011 | Nii | G11C 5/063 365/226 |
| 2012/0170388 A1* | 7/2012 | Choi | G11C 11/413 365/189.16 |
| 2014/0153345 A1 | 6/2014 | Kim et al. | |
| 2014/0233330 A1 | 8/2014 | Ko et al. | |
| 2015/0255148 A1* | 9/2015 | Roy | G11C 11/4096 365/154 |

(Continued)

*Primary Examiner* — Hoai V Ho
(74) *Attorney, Agent, or Firm* — Sterne, Kessler, Goldstein & Fox P.L.L.C.

(57) ABSTRACT

A memory device with an array of memory cells, a write driver circuit, and a write assist circuit is disclosed. The write driver circuit and the write assist circuit can be located opposite to one another relative to the array of memory cells. The write assist circuit can compensate for a parasitic element in bitlines by transferring write voltages to addressed memory cells located in a portion of a memory array opposite to the write driver circuit. The parasitic element can be, for example, a bitline path resistance that causes a voltage differential between a voltage at the output of the write driver circuit and another voltage at a bitline location associated with the addressed memory cell. The write assist circuit can compensate for the voltage differential at the bitline location associated with the addressed memory cell; thus improving the performance of memory write operations.

20 Claims, 7 Drawing Sheets

(56) References Cited

U.S. PATENT DOCUMENTS

| | | |
|---|---|---|
| 2015/0348598 A1 | 12/2015 | Wang et al. |
| 2015/0371702 A1 | 12/2015 | Wu et al. |
| 2015/0380077 A1 | 12/2015 | Wu et al. |
| 2015/0380078 A1 | 12/2015 | Liaw |
| 2016/0042784 A1* | 2/2016 | Rim .................. G11C 11/419 365/154 |

* cited by examiner

MEMORY WITH WRITE ASSIST CIRCUIT

BACKGROUND

The present disclosure generally relates to static random access memory (SRAM).

SRAM is a type of semiconductor memory typically used in computing applications requiring high-speed data access. For example, cache memory applications use SRAMs to store frequently-accessed data—e.g., data accessed by central processing units.

The SRAM's cell structure and architecture enable the high-speed data access. The SRAM cell includes a bi-stable flip-flop structure and transistors that pass voltages from bitlines to the flip-flop structure. A typical SRAM architecture includes one or more arrays of memory cells and support circuitry. The memory cells of each SRAM array are arranged in rows and columns. Access to memory cells in a row is controlled by a "wordline." Data is transferred into (write operation) and out of (read operation) memory cells on "bitlines." There is at least one bitline for each column of memory cells. The support circuitry includes address and driver circuits to access each of the SRAM cells—via the wordlines and bitlines—for various SRAM operations.

BRIEF DESCRIPTION OF THE DRAWINGS

Aspects of the present disclosure are best understood from the following detailed description when read with the accompanying figures. It is noted that, according to the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are merely examples and are not intended to be limiting. In addition, the present disclosure repeats reference numerals and/or letters in the various examples. This repetition is for the purpose of simplicity and clarity and, unless indicated otherwise, does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The following disclosure describes aspects of an SRAM. Specifically, the disclosure describes different embodiments related to an SRAM write operation. For ease of explanation, certain SRAM circuit elements and control logic are disclosed to facilitate in the description of the different embodiments. A person of ordinary skill in the art will understand that SRAMs also include other circuit elements and control logic. These other circuit elements and control logic are within the spirit and scope of this disclosure.

Figure 1:
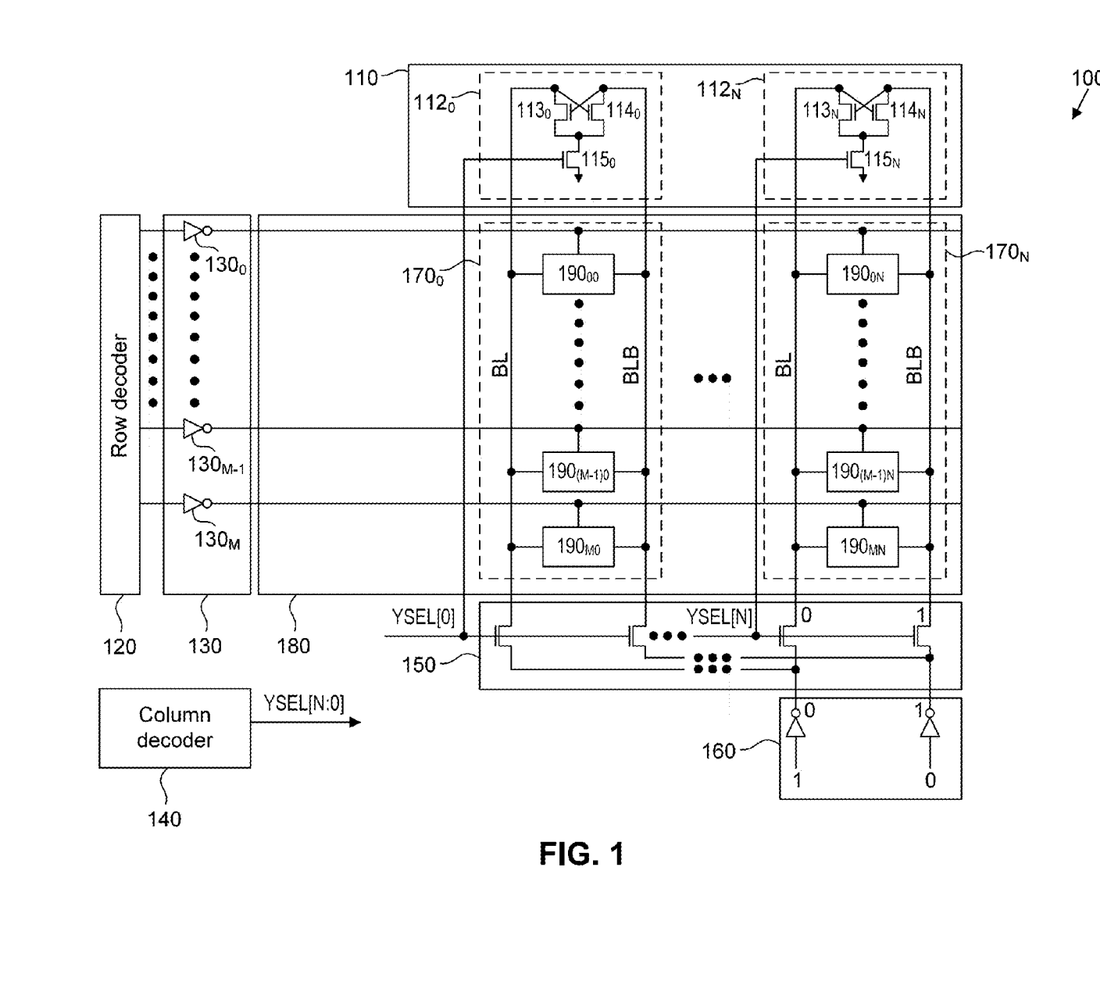
FIG. 1 depicts an SRAM with a write assist circuit, according to embodiments of the present disclosure.

FIG. 1 depicts an SRAM 100 with a write assist circuit 110, according to embodiments of the present disclosure. SRAM 100 also includes a row decoder 120, a wordline driver 130, a column decoder 140, a column multiplexer (MUX) 150, a write driver circuit 160, and columns of SRAM cells $170_0$-$170_N$ in an SRAM array 180. In an embodiment, as illustrated in FIG. 1, write assist circuit 110 and write driver circuit 160 are located opposite to one another relative to SRAM array 180.

Each of the SRAM cells in SRAM array 180 is accessed—e.g., for read and write operations—using a memory address. Based on the memory address row decoder 120 selects a row of memory cells to access via wordline driver 130. Also, based on the memory address, column decoder 140 selects a column of memory cells $170_0$-$170_N$ to access via column MUX 150. In an embodiment, write driver circuit 160 generates voltages for all of the accessed bitline pairs BL/BLB in columns of memory cells $170_0$-$170_N$. The notation "BL" refers to a bitline, and the notation "BLB" refers to the complement of "BL"; the bitline pair BL/BLB concept is well known in the art. The intersection of the accessed row and the accessed column of memory cells results in access to a single memory cell.

Each of columns of memory cells $170_0$-$170_N$ includes SRAM cells 190. A person of ordinary skill in the art would understand that SRAM cells 190 can be arranged in one or more arrays in SRAM 100. In the present disclosure, a single SRAM array 180 is shown to simplify the description of the embodiments. SRAM array 180 has "M" number of rows and "N" number of columns. The notation "$190_{00}$" refers to SRAM cell 190 located in row '0', column $170_0$. Similarly, the notation "$190_{MN}$" refers to SRAM cell 190 located in row 'M', column $170_N$.

Figure 2:
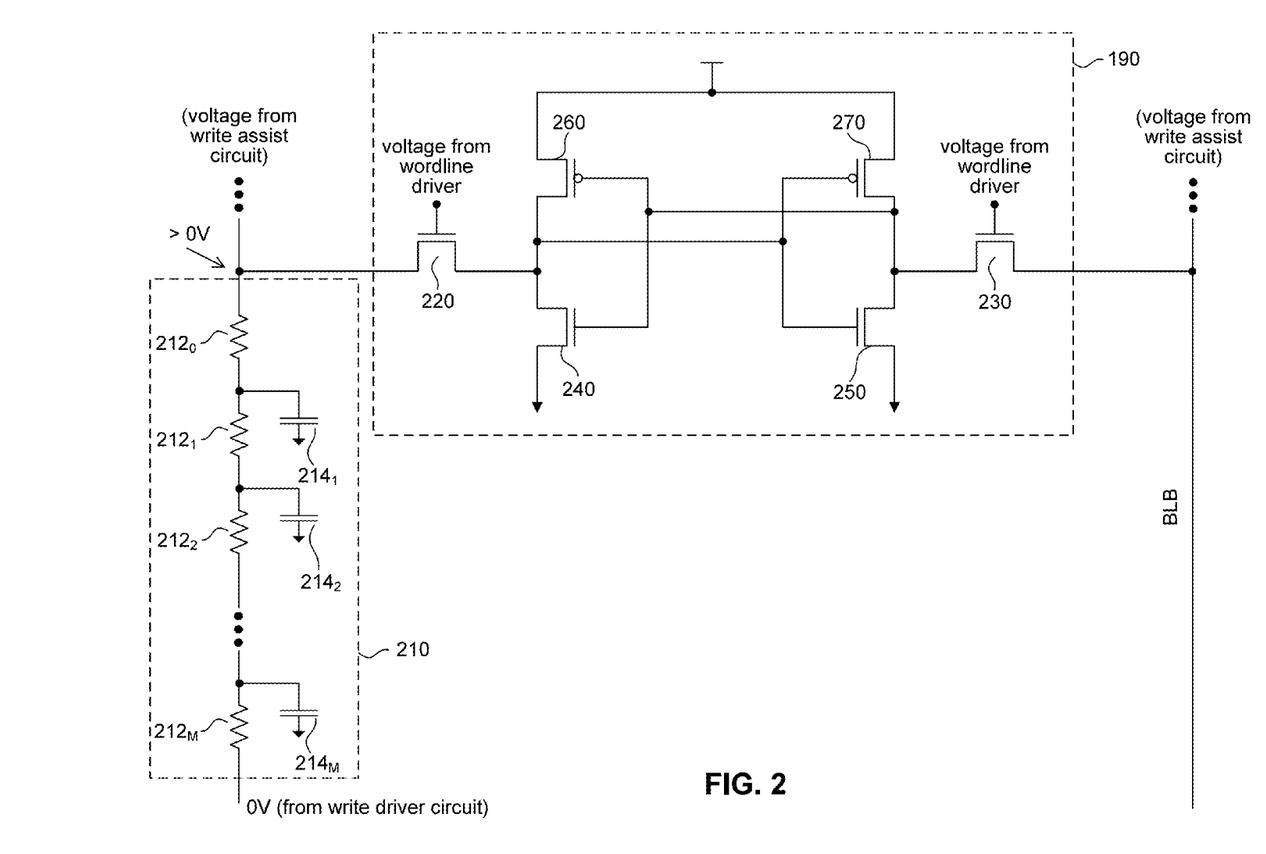
FIG. 2 depicts an example bitline parasitic model and an SRAM cell.

As would be understood by a person of ordinary skill in the art, the SRAM cell can have different circuit topologies. For example, the SRAM cell can have a "4T" or a "6T" circuit topology, which are both well known in the art. FIG. 2 depicts an example "6T" circuit topology. In both "4T" and "6T" circuit topologies, a voltage from wordline driver 130 controls transistors in the SRAM cell to pass voltages from the bitline pair BL/BLB to a bi-stable flip-flop structure in the SRAM cell. A person of ordinary skill in the art would understand that SRAM 100 uses the bitline pair BL/BLB voltages during a write operation.

In referring to FIG. 1, write assist circuit 110 includes pull-down circuits $112_0$-$112_N$ for columns $170_0$-$170_N$, respectively. In an embodiment, each pull-down circuit 112 includes three transistors 113-115. Transistor 115 includes a control terminal connected to a respective column selection control signal YSEL[N:0].

Based on the column selection control signal YSEL, transistors 113-115 pass write driver circuit output voltages to an addressed SRAM cell during a write operation, according to an embodiment. For example, during a write operation for memory cell $190_{ON}$, row decoder 120 activates wordline driver $130_0$. Column decoder 140 selects column $170_N$ via the column's respective MUX transistors in column MUX 150 and the control signal YSEL[N]. Write driver circuit 160 can output logic low (e.g., "0" or VSS) and logic high (e.g., "1" or VDD) voltages to bitlines BL and BLB, respectively, via the selected MUX transistors in column MUX 150. The term "VSS" can refer to a ground potential (e.g., 0V) or a negative supply voltage to SRAM 100. The term "VDD" can refer to a positive supply voltage to SRAM 100 (e.g., 1.2V, 1.8V, 2.4V, 3.3V, and 5V).

The combination of the wordline driver $130_0$ and column decoder 140 voltages passes the voltages from the bitline pair BL/BLB to memory cell $190_{ON}$. With the control signal YSEL[N] at a logic high voltage, the reference voltage from transistor $115_N$—e.g., 0V or ground—passes to the bitline BL via transistor $113_N$ in pull-down circuit $112_N$. As a result, the reference voltage from pull-down circuit $112_N$ passes to memory cell $190_{ON}$.

Write assist circuit 110 confers benefits to SRAM 100 during the write operation. These benefits include compensating for parasitic elements in the bitline pair BL/BLB. FIG. 2 depicts an example bitline parasitic model 210 and an SRAM cell 190. For example and explanation purposes, SRAM cell 190 has a "6T" circuit topology, in which transistors 220 and 230 pass voltages from bitlines BL and BLB, respectively, to the bi-stable flip-flop structure represented by transistors 240, 250, 260, and 270 during the write operation. Bitline parasitic model 210 is depicted for bitline BL for explanation purposes. A person of ordinary skill in the art will recognize that the bitline BLB can have a similar bitline parasitic model.

A network of resistor elements $212_0$-$212_M$ and capacitor elements $214_1$-$214_M$ represents bitline parasitic model 210. Each resistor element 212 represents a bitline BL path resistance between two SRAM cells along a column of memory cells. Each capacitor element 214 represents a parasitic capacitance associated with a pass gate in each SRAM cell—e.g., parasitic capacitance associated with transistor 220 in SRAM cell 190—along the column of memory cells.

During the write operation, an addressed SRAM cell located a farther distance from a write driver circuit—e.g., memory cell $190_{ON}$ in FIG. 1—can receive a bitline voltage different from its intended voltage level. This can be due to a voltage differential between the voltage at the output of the write driver circuit and the voltage at the bitline location associated with the addressed SRAM cell. This voltage differential can be attributed to the bitline path resistance between the write driver circuit and the addressed SRAM cell.

In referring to FIG. 2, resistor elements $212_0$-$210_M$ model the bitline path resistance. If the write driver circuit outputs 0V onto bitline BL, the voltage at an addressed SRAM cell 190—e.g., located a farther distance from the write driver circuit such as, for example, near a top portion of SRAM array 180 in FIG. 1—can be greater than 0V due to the "IR" (current*resistance) voltage drop across resistor elements $212_0$-$212_M$. This voltage drop results in an unintended rise in voltage at the bitline location associated with the addressed SRAM cell. This unintended rise in voltage—e.g., voltage greater than 0V—degrades the write operation of the SRAM cell because the SRAM cell's bi-stable flip-flop structure may not track its voltage level to the intended voltage—i.e., the write circuit output voltage. In other words, the unintended rise in voltage can prevent the SRAM cell from changing state. Advancing process technologies further exacerbate the effects of this IR voltage drop because the bitline parasitic resistance increases as advancing process technologies decrease the bitline's physical dimensions. In addition, density increases in SRAM arrays also exacerbate the effects of the IR voltage drop because bitline length increases as SRAM arrays grow.

The write assist circuit—e.g., write assist circuit 110 in FIG. 1 described above and write assist circuits 310, 410, 510, and 610 in FIGS. 3-6 described below—compensates for the IR voltage drop in the bitlines. For addressed SRAM cells—especially those cells located farther from the write driver circuit (e.g., SRAM cell $190_{ON}$ in FIG. 1)—the write assist circuit "pulls" the voltage at the bitline location associated with the addressed SRAM cell closer to the voltage level at the write driver circuit output. Write assist circuits 110 and 310—described above with respect to FIG. 1 and described below with respect to FIG. 3, respectively—"pulls" the voltage level at the bitline location associated with the addressed SRAM cell closer to 0V (i.e., the voltage level at the output of write driver circuit 160). Write assist circuit 410, 510, and 610—described below with respect to FIGS. 4-6, respectively—"pulls" the voltage level at the bitline location associated with the addressed SRAM cell closer to a negative reference voltage—NVSS (i.e., the voltage level at the output of write driver circuit 420). As a result, the write assist circuit compensates for the IR voltage drop between the write driver circuit output and the addressed SRAM cell, thus reducing the bitline BL parasitic effects during SRAM write operations.

Though the write assist circuit operation is described relative to bitline BL, a person of ordinary skill in the art will recognize that the write assist circuit operates in a similar manner when transferring write driver circuit output voltages to bitline BLB. For example, with a logic low write driver circuit output on the bitline BLB and a logic high write driver circuit output on bitline BL, transistor $114_N$ in pull-down circuit $112_N$ can pass the reference voltage from transistor $115_N$—e.g., 0V or ground—to the bitline BLB. As a result, the reference voltage from pull-down circuit $112_N$ passes to memory cell $190_{ON}$.

In referring to FIG. 1, the bitline pair BL/BLB in unselected column of memory cells $170_0$ is pre-charged to a logic high voltage. Though the output voltage from wordline driver $130_0$ turns "ON" SRAM cell $190_{00}$ in unselected column of memory cells $170_0$, the voltage state of SRAM cell $190_{00}$ is not disturbed. This is because SRAM cell $190_{00}$ and the other unselected SRAM cells are designed to be immune to these types of conditions—e.g., a "dummy read" condition. In other words, the unselected SRAM cells are designed to be stable—and not switch voltage states—when their respective wordline voltage is "ON" and a logic high voltage is applied to the bitline pair BL/BLB. The SRAM cells in unselected columns of memory cells $170_0$-$170_{(N-1)}$ described below in FIGS. 3-6 operate in a similar manner.

Figure 3:
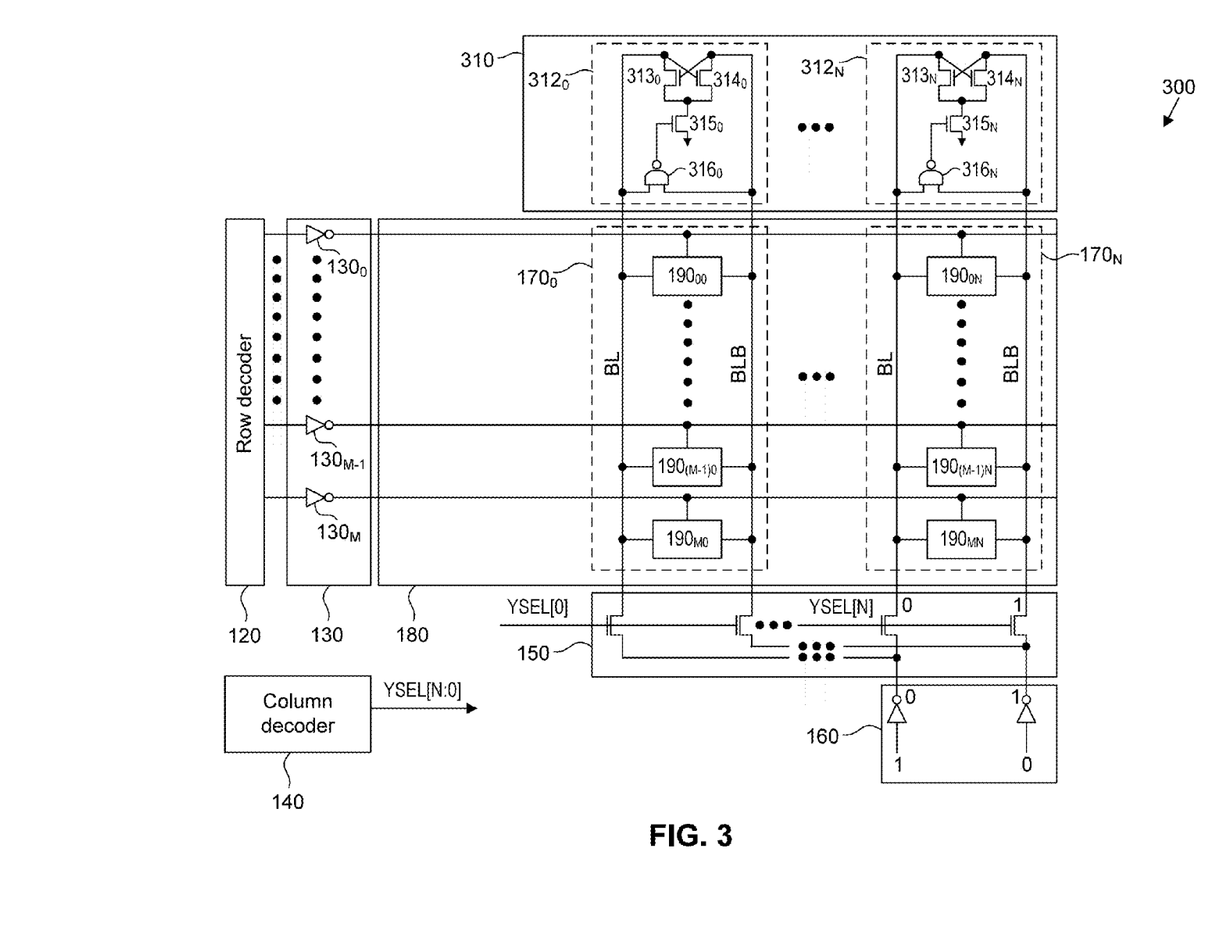
FIG. 3 depicts an SRAM with a write assist circuit, according to embodiments of the present disclosure.

FIG. 3 depicts an SRAM 300 with a write assist circuit 310, according to embodiments of the present disclosure. SRAM 300 and SRAM 100 in FIG. 1 include common elements: row decoder 120; wordline driver 130; column decoder 140; column MUX 150; write driver circuit 160; and columns of SRAM cells $170_0$-$170_N$ in SRAM array 180. These common elements operate in a similar manner as described above with respect to FIG. 1. In an embodiment, as illustrated in FIG. 3, write assist circuit 310 and write driver circuit 160 are located opposite to one another relative to SRAM array 180.

Write assist circuit 310 includes pull-down circuits $312_0$-$312_N$ for columns $170_0$-$170_N$, respectively. In an embodiment, each pull-down circuit 312 includes a cross-coupled device—made up of transistors 313-315—and a logic NAND gate 316. Transistors 313-315 are connected and operate in a similar manner as transistors 113-115 in FIG. 1.

The cross-coupled device and logic NAND gate 316 pass write driver circuit output voltages to an addressed SRAM cell during a write operation. For example, similar to FIG. 1's description above, the combination of the wordline driver $130_0$ and write driver circuit 160 voltages pass the voltages from the bitline pair BL/BLB to memory cell $190_{0N}$. As illustrated in FIG. 3, the voltages on bitline BL and bitline BLB can be a logic low voltage (e.g., "0" or VSS) and a logic high voltage (e.g., "1" or VDD), respectively. The inputs to logic NAND gate 316 receive voltages from the bitline pair BL/BLB and, in this example, logic NAND gate 316 outputs a logic high voltage. This logic high output voltage passes the reference voltage from transistor $315_N$ to the bitline BL via transistor $313_N$ in pull-down circuit $312_N$. As a result, the reference voltage from pull-down circuit $312_N$ passes to memory cell $190_{0N}$.

Though the write assist circuit operation is described relative to bitline BL, a person of ordinary skill in the art will recognize that, the write assist circuit operates in a similar manner when transferring write driver circuit output voltages to bitline BLB. For example, with a logic low write driver circuit output on the bitline BLB and a logic high write driver circuit output on bitline BL, transistor $314_N$ in pull-down circuit $312_N$ can pass the reference voltage from transistor $315_N$—e.g., 0V or ground—to the bitline BLB. As a result, the reference voltage from pull-down circuit $312_N$ passes to memory cell $190_{0N}$.

Write assist circuit 310 confers benefits to SRAM 300 during a write operation. For example, for SRAM cells located farther from the write driver circuit—e.g., SRAM cell $190_{0N}$ in FIG. 3—write assist circuit 310 "pulls" the voltage at the bitline location associated with the addressed SRAM cell closer to 0V—e.g., the voltage level at the write driver circuit output. As a result, write assist circuit 310 compensates for an IR voltage drop between the write driver circuit output and SRAM cell $190_{0N}$.

Figure 4:
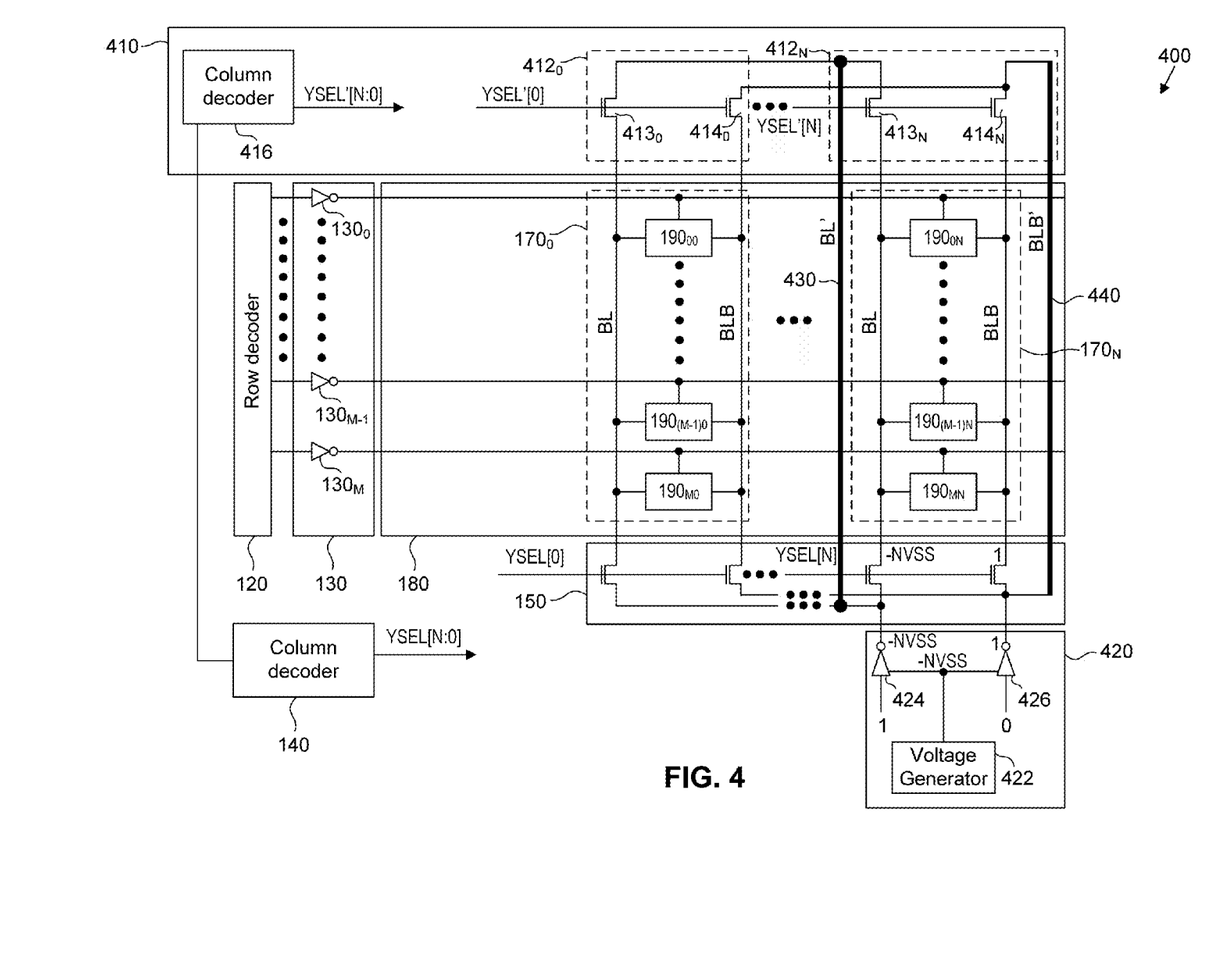
FIG. 4 depicts an SRAM with a write assist circuit, according to embodiments of the present disclosure.

FIG. 4 depicts an SRAM 400 with a write assist circuit 410, according to embodiments of the present disclosure. SRAM 400 and SRAM 100 in FIG. 1 include common elements: row decoder 120; wordline driver 130; column decoder 140; column MUX 150; and columns of SRAM cells $170_0$-$170_N$ in SRAM array 180. These common elements operate in a similar manner as described above with respect to FIG. 1. SRAM 400 also includes a write driver circuit 420. In an embodiment, as illustrated in FIG. 4, write assist circuit 410 and write driver circuit 420 are located opposite to one another relative to SRAM array 180.

In an embodiment, SRAM array 180 includes another set of bitlines BL' 430 and BLB' 440 (also referred to herein as "the second set of bitlines BL' 430 and BLB' 440"). The second set of bitlines BL' 430 and BLB' 440 provides another path—e.g., a shunt path—for voltages to pass from write driver circuit 420 to SRAM cell located farther from the write driver circuit. The second set of bitlines BL' 430 and BLB' 430 parallels the bitline pair BL/BLB and traverses through SRAM array 180, according to an embodiment. In an embodiment, SRAM array 180 includes one or more sets of bitlines BL' 430 and BLB' 440. The number of sets of bitlines BL' 430 and BLB' 440 can depend on the number of input/output (I/O) ports associated with the SRAM array, according to an embodiment. For example, SRAM array 180 can include one set of bitlines BL' 430 and BLB' 440 per I/O port.

In an embodiment, the bitline path resistance of each of bitline BL' 430 and BLB' 440 is lower than the bitline path resistance of each of the bitline BL and bitline BLB, respectively. By having a lower bitline path resistance, the second set of bitlines BL' 430 and BLB' 440 reduces the IR voltage drop between a write driver circuit output and an SRAM cell located farther from the write driver circuit. As a result, the bitline BL/BLB parasitic effects during SRAM write operations are reduced and SRAM write operations are improved.

Write driver circuit 420 generates voltages for the bitline pair BL/BLB and the second set of bitlines BL' 430 and BLB' 440. In an embodiment, write driver circuit 420 includes a voltage generator 422 and inverters 424 and 426. Voltage generator 422 generates a negative reference voltage—NVSS, which serves as a low voltage supply terminal to inverters 424 and 426, according to an embodiment. In an embodiment, the negative reference voltage—NVSS is set to a value based on the bitline path resistance of the second set of bitlines BL' 430 and BLB' 440. For example, if a 50 mV IR drop is desired at an SRAM memory cell farthest from a write driver circuit output, then the negative reference voltage—NVSS can be set to a value based on the IR voltage drop in the second set of bitlines BL' 430 and BLB' 440. This negative reference voltage—NVSS can be, for example, -200 mV. And, if the IR voltage drop between the write driver circuit output and the SRAM memory cell farthest from the write driver circuit output is 50 mV, then the voltage at the bitline location associated with the SRAM cell is -150 mV.

Each of inverters 424 and 426 outputs either the negative reference voltage—NVSS or a logic high voltage (e.g., "1" or VDD) onto bitline BL/BL' and bitline BLB/BLB', according to an embodiment. If the inverter receives a logic high voltage at its input, then the inverter outputs the negative reference voltage—NVSS. Conversely, if the inverter receives a logic low voltage (e.g., "0" or VSS) at its input, then the inverter outputs a logic high voltage.

Write assist circuit 410 includes pull-down circuits $412_0$-$412_N$ for columns $170_0$-$170_N$, respectively, and a column decoder 416. In an embodiment, each pull-down circuit 412 includes transistors 413 and 414 (also referred to herein as "pass gates"), which passes voltages from the second set of bitlines BL' 430 and BLB' 440 to bitlines BL and BLB, respectively. Specifically, the write driver circuit output voltages are passed to transistors 413 and 414 via the second set of bitlines BL' 430 and BLB' 440, respectively, according to an embodiment.

Based on the column selection control signal YSEL' provided by column decoder 416, transistors 413 and 414 pass the write driver circuit output voltages from the second set of bitlines BL' 430 and BLB' 440 to bitlines BL and BLB, respectively. For example, during a write operation for memory cell $190_{0N}$, row decoder 120 activates wordline driver $130_0$. Column decoder 140 selects column $170_N$ via the control signal YSEL[N] and the column's respective MUX transistors in column MUX 150. Column decoder 416 also selects column $170_N$ and transistors $413_N$ and $414_N$ in pull-down circuit $412_N$ via the control signal YSEL'[N]. Write driver circuit 420 can output logic low (e.g., the negative reference voltage—NVSS) and logic high (e.g., "1" or VDD) voltages to bitlines BL/BL' and BLB/BLB', respectively. Because transistors $413_N$ and $414_N$ are "ON," the voltages on bitlines BL' 430 and BLB' 440 pass to bitlines BL and BLB, respectively. As a result, the logic low voltage—e.g., negative reference voltage—NVSS—passes to memory cell $190_{ON}$.

Write assist circuit 410 confers benefits to SRAM 400 during the write operation. Specifically, write assist circuit 410 compensates for the parasitic elements in the bitline BL during SRAM write operations. For addressed SRAM cells—especially those cells located farther from the write driver circuit (e.g., SRAM cell $190_{ON}$ in FIG. 4)—write assist circuit 410 "pulls" the voltage at the bitline location associated with the addressed SRAM cell closer to the negative reference voltage—NVSS—e.g., the voltage level at the write driver circuit output. As a result, write assist circuit 410 compensates for the IR voltage drop between the write driver circuit output and SRAM cell $190_{ON}$, thus reducing the bitline BL parasitic effects during SRAM write operations.

Though the write assist circuit operation is described relative to bitlines BL and BL', a person of ordinary skill in the art will recognize that the write assist circuit operates in a similar manner when transferring write driver circuit output voltages to bitlines BLB and BLB' 440. For example, with a negative reference voltage—NVSS write driver circuit output on bitline BLB' 440, transistor $414_N$ in pull-down circuit $412_N$ can pass the negative reference voltage—NVSS from bitline BLB' 440 to memory cell $190_{ON}$.

Figure 5:
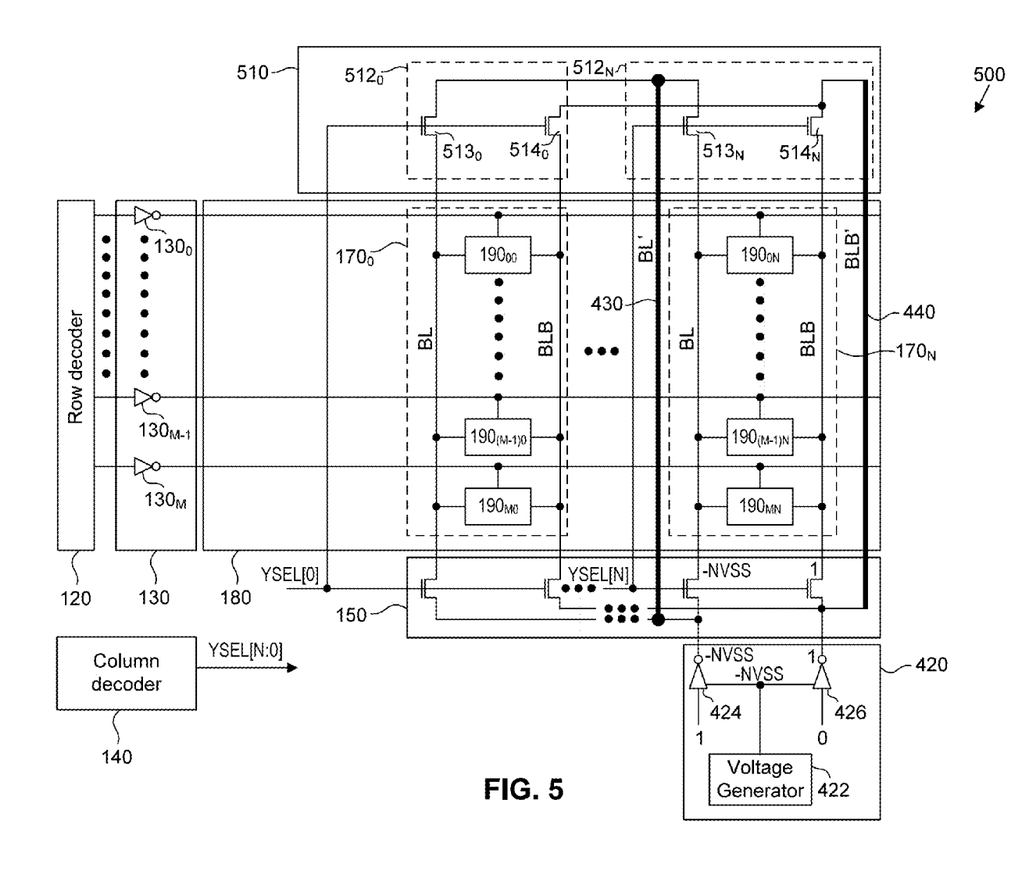
FIG. 5 depicts an SRAM with a write assist circuit, according to embodiments of the present disclosure.

FIG. 5 depicts an SRAM 500 with a write assist circuit 510, according to embodiments of the present disclosure. SRAM 500 and SRAM 100 in FIG. 1 include common elements: row decoder 120; wordline driver 130; column decoder 140; column MUX 150; and columns of SRAM cells $170_0$-$170_N$ in SRAM array 180. SRAM 500 and SRAM 400 in FIG. 4 include common elements: write driver circuit 420; and the second set of bitlines BL' 430 and BLB' 440. These common elements operate in a similar manner as described above with respect to FIGS. 1 and 4. In an embodiment, as illustrated in FIG. 5, write assist circuit 510 and write driver circuit 420 are located opposite to one another relative to SRAM array 180.

Write assist circuit 510 includes pull-down circuits $512_0$-$512_N$ for columns $170_0$-$170_N$, respectively. In an embodiment, each pull-down circuit 512 includes transistors 513 and 514 (also referred to herein as "pass gates"), which pass write driver circuit output voltages from the second set of bitlines BL' 430 and BLB' 440 to bitlines BL and BLB, respectively. Control terminals of transistors 513 and 514 in each of pull down circuits $512_0$-$512_N$ are connected to a respective column selection control signal YSEL[N:0].

Based on the column selection control signal YSEL provided by column decoder 140, transistors 513 and 514 pass the write driver circuit output voltages from the second set of bitlines BL' 430 and BLB' 440 to bitlines BL and BLB, respectively. For example, during a write operation for memory cell $190_{ON}$, row decoder 120 activates wordline driver $130_0$. Column decoder 140 selects column $170_N$ and the column's respective MUX transistors in column MUX 150 via the control signal YSEL[N]. The control signal YSEL[N] also turns "ON" transistors $513_N$ and $514_N$ in pull-down circuit $512_N$. Write driver circuit 420 can output logic low (e.g., the negative reference voltage—NVSS) and logic high (e.g., "1" or VDD) voltages to bitlines BL/BL' and BLB/BLB', respectively. Because transistors $513_N$ and $514_N$ are "ON," the voltages on bitlines BL' 430 and BLB' 440 pass to bitlines BL and BLB, respectively. As a result, the logic low voltage—e.g., negative reference voltage—NVSS—passes to memory cell $190_{ON}$.

Write assist circuit 510 confers benefits to SRAM 500 during the write operation. Specifically, write assist circuit 510 compensates for the parasitic elements in the bitline BL during SRAM write operations. For addressed SRAM cells—especially those cells located farther from the write driver circuit (e.g., SRAM cell $190_{ON}$ in FIG. 5)—write assist circuit 510 "pulls" the voltage at the bitline location associated with the addressed SRAM cell closer to the negative reference voltage—NVSS—e.g., the voltage level at the write driver circuit output. As a result, write assist circuit 510 compensates for the IR voltage drop between the write driver circuit output and SRAM cell $190_{ON}$, thus reducing the bitline BL parasitic effects during SRAM write operations. Though the write assist circuit operation is described relative to bitlines BL and BL', a person of ordinary skill in the art will recognize that, the write assist circuit operates in a similar manner when transferring write driver circuit output voltages to bitlines BLB and BLB' 440. For example, with a negative reference voltage—NVSS write driver circuit output on bitline BLB' 440, transistor $514_N$ in pull-down circuit $512_N$ can pass the negative reference voltage—NVSS from bitline BLB' 440 to memory cell $190_{ON}$.

Figure 6:
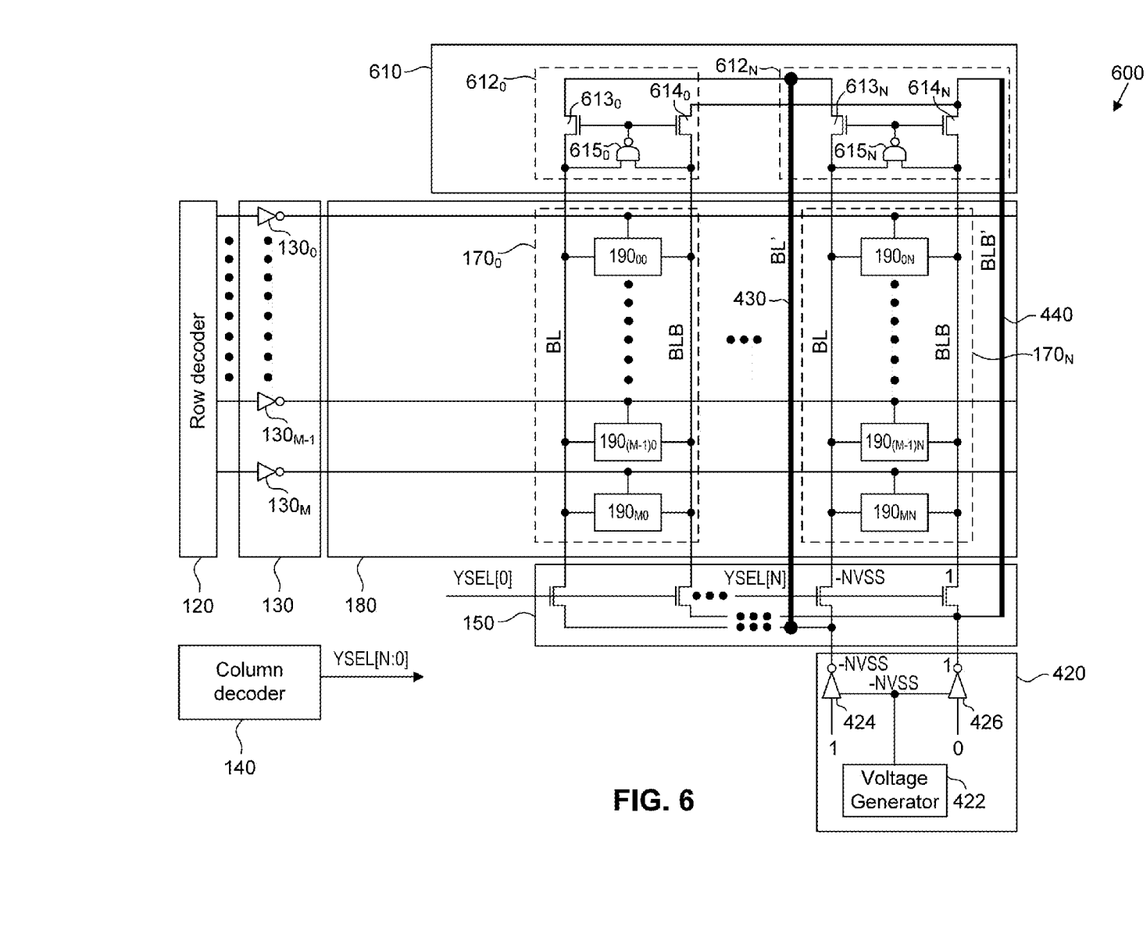
FIG. 6 depicts an SRAM with a write assist circuit, according to embodiments of the present disclosure.

FIG. 6 depicts an SRAM 600 with a write assist circuit 610, according to embodiments of the present disclosure. SRAM 600 and SRAM 100 in FIG. 1 include common elements: row decoder 120; wordline driver 130; column decoder 140; column MUX 150; and columns of SRAM cells $170_0$-$170_N$ in SRAM array 180. SRAM 600 and SRAM 400 in FIG. 4 include common elements: write driver circuit 420; and the second set of bitlines BL' 430 and BLB' 440. These common elements operate in a similar manner as described above with respect to FIGS. 1 and 4. In an embodiment, as illustrated in FIG. 6, write assist circuit 610 and write driver circuit 420 are located opposite to one another relative to SRAM array 180.

Write assist circuit 610 includes pull-down circuits $612_0$-$612_N$ for columns $170_0$-$170_N$, respectively. In an embodiment, each pull-down circuit 612 includes a transistor 613, a transistor 614, and a logic NAND gate 615.

Transistors 613 and 614 and logic NAND gate 615 pass write driver circuit output voltages to an addressed SRAM cell during a write operation. For example, similar to FIG. 1's description above, the combination of the wordline driver $130_0$ and column decoder 140 voltages pass the voltages from the bitline pair BL/BLB to memory cell $190_{ON}$. As illustrated in FIG. 6, the voltages on bitline BL and bitline BLB can be a logic low voltage (e.g., the negative reference voltage—NVSS) and a logic high voltage (e.g., "1" or VDD), respectively. The inputs to logic NAND gate 615 receive voltages on the bitline pair BL/BLB and, in this example, logic NAND gate 615 outputs a logic high voltage. This logic high output voltage turns "ON" transistors $613_N$ and $614_N$. Because transistors $613_N$ and $614_N$ are "ON," the voltages on bitlines BL and BLB pass to bitlines BL' 430 and BLB' 440, respectively. As a result, the logic low voltage—e.g., negative reference voltage—NVSS—passes to memory cell $190_{ON}$.

Write assist circuit 610 confers benefits to SRAM 600 during a write operation. Specifically, write assist circuit 610 compensates for the parasitic elements in the bitline BL during SRAM write operations. For addressed SRAM cells—especially those cells located farther from the write driver circuit (e.g., SRAM cell $190_{ON}$ in FIG. 6)—write assist circuit 610 "pulls" the voltage at the bitline location associated with the addressed SRAM cell closer to the negative reference voltage—NVSS—e.g., the voltage level at the write driver circuit output. As a result, write assist circuit 610 compensates for the IR voltage drop between the write driver circuit output and SRAM cell $190_{ON}$, thus reducing the bitline BL parasitic effects during SRAM write operations.

Though the write assist circuit operation is described relative to bitlines BL and BL', a person of ordinary skill in the art will recognize that, the write assist circuit operates in a similar manner when transferring write driver circuit output voltages to bitlines BLB and BLB' 440. For example, with a negative reference voltage—NVSS write driver circuit output on bitline BLB and a logic high write driver circuit output on bitline BL, transistor $614_N$ in pull-down circuit $612_N$ can pass the negative reference voltage—NVSS from bitline BLB' 440 to memory cell $190_{ON}$.

Figure 7:
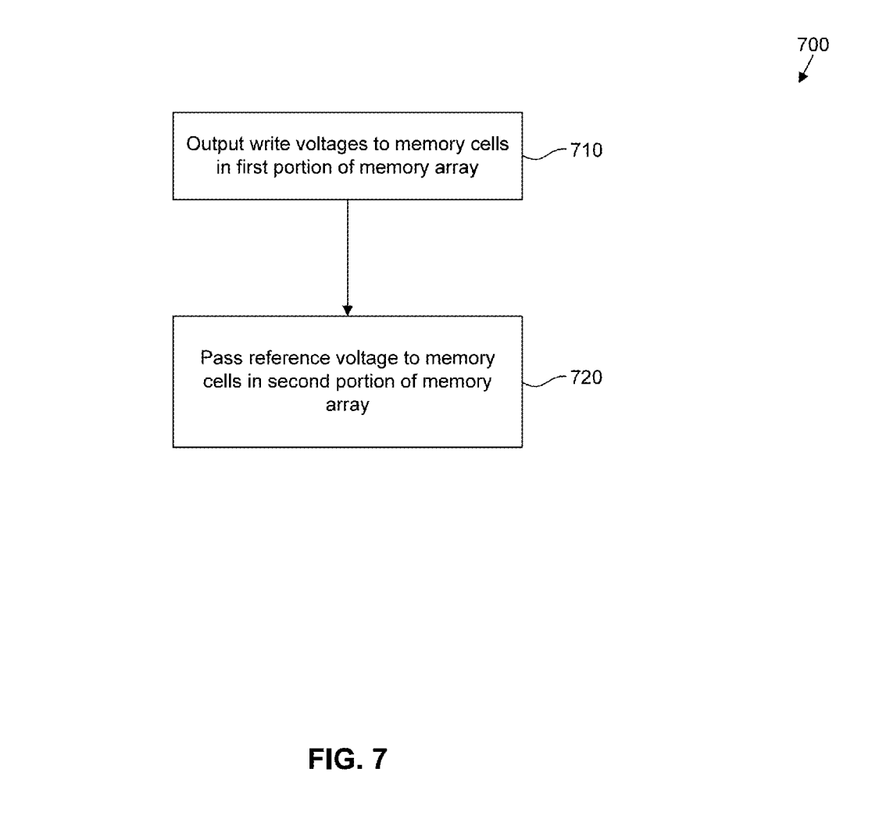
FIG. 7 depicts a method for a memory write operation, according to embodiments of the present disclosure.

FIG. 7 depicts a method 700 for a memory write operation, according to embodiments of the present disclosure. In an embodiment, each of SRAMs 100 and 300-600 in FIGS. 1 and 3-6, respectively, can perform the steps of method 700.

In step 710, a write driver circuit outputs write voltages to memory cells in a first portion of a memory array. In an embodiment, the write driver circuit is proximate or adjacent to memory cells in the first portion of a memory array. The first portion can be a top portion of the memory array as illustrated in, for example, FIGS. 1 and 3-6. Each memory cell is configured to be selected and receive the write voltages via bitlines coupled respectively to each of the memory cells. Examples of the write driver circuit are described above with respect to write driver circuit 160 in FIGS. 1 and 3 and write driver circuit 420 in FIGS. 4-6. In an embodiment, the write driver circuit outputs the write voltages to each of the memory cells via the bitlines and secondary bitlines—e.g., the second set of bitlines BL' 430 and BLB' 440 in FIGS. 4-6. The write voltages can be a reference voltage—e.g., 0V or a negative reference voltage—NVSS—according to an embodiment.

In step 720, a write assist circuit passes the reference voltage—e.g., 0V or a negative reference voltage—NVSS—to memory cells in a second portion of the memory array. In an embodiment, the write assist circuit is proximate or adjacent to the second portion of the memory array. The second portion can be a bottom portion of the memory array as illustrated in, for example, FIGS. 1 and 2-6. Examples of the write assist circuit are described above with respect to write assist circuit 110, 310, 410, 510, and 610 in FIGS. 1 and 3-6, respectively. In an embodiment, the write assist circuit reduces a voltage differential between a voltage at an output of the write driver circuit and another voltage at a bitline location associated with an addressed memory cell.

The above disclosure describes different SRAM embodiments with a write assist circuit—e.g., write assist circuit 110, 310, 410, 510, and 610 in FIGS. 1 and 3-6, respectively. The write assist circuit confers benefits to the SRAM during a write operation. Specifically, the write assist circuit compensates for the parasitic elements in the bitline BL during SRAM write operations. For addressed SRAM cells—especially those cells located farther from the write driver circuit (e.g., SRAM cell $190_{ON}$ in FIG. 1)—the write assist circuit "pulls" the voltage at the bitline location associated with the addressed SRAM cell closer to a reference voltage—e.g., 0V or a negative reference voltage—NVSS. As a result, the write assist circuit compensates for the IR voltage drop between the write driver circuit output and SRAM cells located farther from the write driver circuit, thus reducing the bitline BL parasitic effects during SRAM write operations and improving SRAM write operations.

Based on the above description, embodiments of the present disclosure can be described as a memory device and a method for a memory write operation.

An embodiment of the memory device includes an array of memory cells, a write driver circuit, and a write assist circuit. The array of memory cells has a top portion with a first plurality of memory cells and a bottom portion with a second portion of memory cells. The write driver circuit can be proximate or adjacent to the bottom portion of the array and configured to output write voltages to the memory cells in the array via bitlines coupled to the memory cells. The write assist circuit can be proximate or adjacent to the top portion of the array and include transistors coupled to a plurality of the bitlines. The transistors in the write assist circuit pass a reference voltage to the first plurality of memory cells.

Another embodiment of the memory device includes an array of memory cells with first and second sets of bitlines, a write driver circuit, and a write assist circuit. The first set of bitlines in the array connects to the memory cells. The second set of bitlines in the array couples to the memory cells via pass gates. The write driver circuit is proximate or adjacent to memory cells in a first portion of the array and configured to output write voltages to the memory cells via the first and second sets of bitlines. The write assist circuit is proximate or adjacent to memory cells in a second portion of the array and configured to pass the write voltages to the memory cells in the second portion of the array via the second set of bitlines.

An embodiment of the method for the memory write operation includes two steps. The first step outputs—with a write driver circuit proximate or adjacent to memory cells in a first portion of a memory array—write voltages to the memory cells via bitlines coupled to the memory cells. The second step passes—with a write assist circuit proximate or adjacent to memory cells in a second portion of the memory array—a reference voltage to the memory cells in the second portion.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   an array of memory cells having a top portion associated with a first plurality of memory cells and a bottom portion associated with a second plurality of memory cells;
   a write driver circuit, adjacent to the bottom portion of the array, configured to output a plurality of write voltages to the first plurality of memory cells and the second plurality of memory cells via a first set of bitlines and a second set of bitlines, respectively; and
   a write assist circuit, adjacent to the top portion of the array, configured to pass a subset of the plurality of write voltages on the second set of bitlines from among the plurality of write voltages to corresponding bitlines from among the first set of bitlines.

2. The memory device of claim 1, wherein the first plurality of memory cells and the second plurality of memory cells comprise a plurality of static random access memory cells.

3. The memory device of claim 1, wherein the write driver circuit and the write assist circuit are located opposite to one another relative to the array of memory cells.

4. The memory device of claim 1, wherein a parasitic element is associated with a voltage differential between a first voltage at an output of the write driver circuit and a second voltage at a bitline from among the first set of bitlines which is associated with an addressed memory cell from among the array of memory cells.

5. The memory device of claim 1, wherein the write assist circuit is configured to pass a reference voltage to an addressed memory cell from among the array of memory cells based on a control signal received from a column decoder.

6. The memory device of claim 5, wherein the control signal corresponds to a selected column of the array of memory cells.

7. The memory device of claim 1, wherein the write assist circuit is configured to pass a reference voltage to an addressed memory cell from among the array of memory cells based on voltages on bitlines from among the first set of bitlines and the second set of bitlines which are associated with the addressed memory cell.

8. A method for a memory write operation, the method comprising:
outputting, with a write driver circuit adjacent to a plurality of memory cells in a first portion of a memory array, a plurality of write voltages to the plurality of memory cells via a first set of bitlines and a second set of bitlines coupled to the plurality of memory cells; and
passing, with a write assist circuit adjacent to the plurality of memory cells in a second portion of the memory array, a subset of the plurality of write voltages on the second set of bitlines from among the plurality of write voltages to corresponding bitlines from among the first set of bitlines.

9. The method of claim 8, wherein the passing comprises:
reducing a voltage differential between a first voltage at an output of the write driver circuit and a second voltage at a bitline from the first set of bitlines which is associated with an addressed memory cell from among the plurality of memory cells.

10. A memory system comprising:
an array of memory cells having a top portion of memory cells and a bottom portion of memory cells;
a row decoder configured to select a row of memory cells in the array of memory cells;
a column decoder configured to select a column of memory cells in the array of memory cells, wherein an intersection of the selected row of memory cells and the selected column of memory cells accesses a single memory cell in the array of memory cells; and
a write assist device comprising:
a write driver circuit, adjacent to the bottom portion of memory cells, configured to output a write voltage to the single memory cell via a first bitline and a second bitline, the first bitline being coupled to the single memory cell; and
a write assist circuit, adjacent to the top portion of the memory cells, configured to pass the write voltage on the second bitline to the first bitline.

11. The memory system of claim 10, wherein the top portion of memory cells and the bottom portion of memory cells comprise a plurality of static random access memory cells.

12. The memory system of claim 10, wherein the write driver circuit and the write assist circuit are located opposite to one another relative to the array of memory cells.

13. The memory system of claim 10, wherein the write voltage comprises:
a logic low voltage; or
a logic high voltage.

14. The memory system of claim 10, wherein a parasitic element is associated with a voltage differential between a first voltage at an output of the write driver circuit and a second voltage at the first bitline which is associated with an addressed memory cell from among the array of memory cells.

15. The memory system of claim 10, wherein the write assist circuit is configured to pass a reference voltage to the single memory cell based on a control signal received from the column decoder.

16. The memory system of claim 10, wherein the write assist circuit is configured to pass a reference voltage to the single memory cell based on the first bitline and the second bitline.

17. The memory device of claim 1, wherein a bitline path resistance of a first bitline of the second set of bitlines is lower than a bitline path resistance of a corresponding second bitline of the first set of bitlines.

18. The memory device of claim 1, wherein the write assist circuit comprises:
a plurality of transistors configured to pass the subset of the plurality of write voltages on the second set of bitlines to the corresponding bitlines from among the first set of bitlines.

19. The memory system of claim 10, wherein a bitline path resistance of the second bitline is lower than a bitline path resistance of the first bitline.

20. The memory system of claim 10, wherein the write assist circuit comprises:
a transistor configured to pass the write voltages on the second bitline to the first bitline.

* * * * *